ND_ID US006001744A

United States Patent [19]
Doi

[11] Patent Number: 6,001,744
[45] Date of Patent: Dec. 14, 1999

[54] METHOD OF CLEANING A SURFACE OF A COMPOUND SEMICONDUCTOR CRYSTAL OF GROUP II-VI ELEMENTS OF PERIODIC TABLE

[75] Inventor: Hideyuki Doi, Osaka, Japan

[73] Assignee: Sumitomo Electric Industries, Ltd., Osaka, Japan

[21] Appl. No.: 08/917,776

[22] Filed: Aug. 27, 1997

[30] Foreign Application Priority Data

Aug. 30, 1996 [JP] Japan .................................... 8-230304
Jun. 30, 1997 [JP] Japan .................................... 9-173971

[51] Int. Cl.$^6$ ................................................. H01L 21/301
[52] U.S. Cl. ................................................................ 438/745
[58] Field of Search .............................................. 438/745

[56] References Cited

U.S. PATENT DOCUMENTS

| | | | |
|---|---|---|---|
| 3,850,686 | 11/1974 | Flowers | 438/778 |
| 4,456,630 | 6/1984 | Basol | 438/745 |
| 4,897,152 | 1/1990 | Chen | 156/637 |
| 5,366,927 | 11/1994 | Schetzina | 437/185 |
| 5,439,553 | 8/1995 | Grant et al. | 216/58 |
| 5,445,706 | 8/1995 | Okuno et al. | 156/637.1 |

OTHER PUBLICATIONS

Patent Abstracts of Japan, vol. 017, No. 463, Aug. 24, 1993 & JP 05 109694 A (Toshiba Corp), Apr. 30, 1993 * abstract *.

M.W. Cho et al., "Surface Treatment of ZnSe Substrate and Homoepitaxy of ZnSe", Journal of Electronic Materials, vol. 26, No. 5, pp. 423–428, 1997.

*Primary Examiner*—Benjamin Utech
*Assistant Examiner*—Lynette T. Umez-Eronini
*Attorney, Agent, or Firm*—Wenderoth, Lind & Ponack L.L.P.

[57] ABSTRACT

A surface of a compound semiconductor crystal of Group II–VI elements of Periodic Table can be cleaned to obtain a mirror surface suitable for epitaxial growth, without deteriorating the smoothness of the surface after etching. The feature of a method of cleaning a surface of the compound semiconductor crystal consists in using an etching solution consisting of an aqueous solution of a mixture of sulfuric acid and water in a proportion by volume of 1 to 10 parts of sulfuric acid to 1 part of water, saturated with potassium dichromate, etching the compound semiconductor crystal of Group II–VI elements of Periodic Table with the etching solution at a temperature within a range of 10 to 80° C., and if necessary, washing with water at a temperature of from 10° C. to the boiling point, methanol or isopropyl alcohol, or subjecting to ultrasonic washing or boiling washing in dichloromethane, trichloroethylene or acetone.

17 Claims, 1 Drawing Sheet

SURFACE (A)

SURFACE (B)

SURFACE (C)

SURFACE (A)

SURFACE (B)

SURFACE (C)

6,001,744

METHOD OF CLEANING A SURFACE OF A COMPOUND SEMICONDUCTOR CRYSTAL OF GROUP II-VI ELEMENTS OF PERIODIC TABLE

BACKGROUND OF THE INVENTION

1. Field of the Invention

This invention relates to a method of cleaning a surface of a compound semiconductor crystal of Group II–VI elements of Periodic Table, such as ZnSe, ZnSSe, ZnS, ZnMgSe, ZnMgSSe, ZnTe, etc.

2. Description of the Related Art

It has hitherto been reported that ZnSe crystal is etched with an aqueous solution of NaOH or $NH_4OH/H_2O_2$ or etched with a saturated solution of potassium dichromate in sulfuric acid at 90° C. and treated with carbon disulfide, thereby cleaning the crystal surface (Cf. "J. Crystal Growth" 86 (1988), pp 324). Furthermore, it has been reported that ZnSe crystal is etched with a solution of bromine/methanol and subjected to ultrasonic washing in trichloroethylene (Cf. Japanese Patent Laid-Open Publication No. 18200/1984) and that ZnSe crystal is etched with a solution of sulfuric acid/ hydrogen peroxide/water and then cleaned with carbon disulfide to remove Se on the crystal surface (Cf. Japanese Patent Laid-Open Publication No. 109694/1993).

According to the above described cleaning methods, however, there arise disadvantages that the crystal surface is roughened, Se is deposited to be remarkably red, pits occur due to crystal defects, impurities such as Na, etc. in an etching solution remain and a clean, flat and mirror surface cannot be obtained. Thus, etching cannot be carried out in such a depth that a damage layer is removed. Consequently, an epitaxial thin film of high quality cannot be grown on a crystal obtained by the above described surface cleaning method.

SUMMARY OF THE INVENTION

It is an object of the present invention to provide a method of cleaning a surface of a compound semiconductor crystal of Group II–VI elements of Periodic Table, whereby the above described problem can be solved and the smoothness of the surface of a compound semiconductor crystal of Group II–VI elements of Periodic Table is not deteriorated after eching.

It is another object of the present invention to provide a method of cleaning a surface of a compound semiconductor crystal of Group II–VI elements of Periodic Table to obtain a mirror surface suitable for epitaxial growth.

These objects can be attained by a method of cleaning a surface of a compound semiconductor crystal of Group II–VI elements of Periodic Table, which comprises using an etching solution consisting of an aqueous solution of a mixture of sulfuric acid and water in a proportion by volume of 1 to 10 parts of sulfuric acid to 1 part of water, saturated with potassium dichromate, and etching the compound semiconductor crystal of Group II–VI elements of Periodic Table with the etching solution at a temperature within a range of 10 to 80° C.

BRIEF DESCRIPTION OF THE DRAWINGS

The accompanying drawings illustrate the principle and merits of the present invention in detail.

DETAILED DESCRIPTION OF THE INVENTION

Figure 1A:
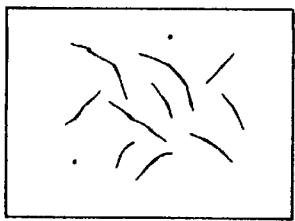
FIG. 1 is a schematic view of a pattern of a crystal surface state after etching.

The inventors have made various efforts to improve the prior art cleaning methods for obtaining surface-cleaned compound semicondcutor crystal on which epitaxial thin films of high quality can be grown, and consequently, have found that use of a specified etching solution consisting of aqueous sulfuric acid solution saturated with potassium dichromate is useful for the epitaxial growth of compound semicondcutor crystals. The present invention is based on this finding.

That is to say, the feature of the present invention consists in an etching step with the specified etching solution and a specified after-treating step, in combination, as described below:

(1) A method of cleaning a surface of a compound semiconductor crystal of Group II–VI elements of Periodic Table, which comprises using an etching solution consisting of an aqueous solution of a mixture of sulfuric acid and water in a proportion by volume of 1 to 10 parts, preferably 3 to 7 parts of sulfuric acid to 1 part of water, saturated with potassium dichromate, and etching the compound semiconductor crystal of Group II–VI elements of Periodic Table with the etching solution at a temperature within a range of 10 to 80° C., preferably 20 to 50° C.

(2) The method of cleaning a surface of a compound semiconductor crystal of Group II–VI elements of Periodic Table, as described in the above (1), wherein the etching solution used in the etching step is removed by washing with water at a temperature of from 10° C. to the boiling point thereof, preferably 20 to 50° C. to suppress precipitation of the Group VI element.

(3) The method of cleaning a surface of a compound semiconductor crystal of Group II–VI elements of Periodic Table, as described in the above (1), wherein the etching solution used in the etching step is removed by washing with methanol or isopropyl alcohol to suppress precipitation of the Group VI element.

(4) The method of cleaning a surface of a compound semiconductor crystal of Group II–VI elements of Periodic Table, as described in the above (2) or (3), wherein the Group VI element precipitated on the crystal surface in a very small amount after the washing step is removed by subjecting to ultrasonic washing or boiling washing in dichloromethane or trichloroethylene.

(5) The method of cleaning a surface of a compound semiconductor crystal of Group II–VI elements of Periodic Table, as described in the above (4), wherein the Group VI element precipitated on the crystal surface in a very small amount is removed by providing a step of subjecting to ultrasonic washing or boiling washing in acetone during the step of subjecting to ultrasonic washing or boiling washing in dichloromethane or trichloroethylene.

(6) The method of cleaning a surface of a compound semiconductor crystal of Group II–VI elements of Periodic Table, as described in the above (2) or (3), wherein the Group VI element precipitated on the crystal surface in a very small amount after the washing step is removed by subjecting to a heat treatment at a temperature of at least 200° C., preferably 200 to 350° C.

(7) The method of cleaning a surface of a compound semiconductor crystal of Group II–VI elements of Periodic Table, as described in the above (2) or (3), wherein the Group VI element precipitated on the crystal surface in a very small amount after the washing step is removed by subjecting to an immersion treatment in a solution containing at least one of carbon disulfide and carbon tetrachloride.

(8) The method of cleaning a surface of a compound semiconductor crystal of Group II–VI elements of Periodic Table, as described in the above (2) or (3), wherein oxides on the crystal surface after the washing step are removed by subjecting to an immersion treatment in a solution containing hydrochloric acid or hydrofluoric acid or ammonium hydroxide and methanol.

(9) The method of cleaning a surface of a compound semiconductor crystal of Group II–VI elements of Periodic Table, as described in any one of the above (4) to (7), wherein oxides on the crystal surface after removing the Group VI element are removed by subjecting to an immersion treatment in a solution containing hydrochloric acid or hydrofluoric acid or ammonium hydroxide and methanol.

According to the present invention, it is found effective for reproducing a flat and mirror-like crystal surface to etch a compound semiconductor crystal of Group II–VI elements of Periodic Table by using an etching solution consisting of an aqueous solution of a mixture of 1 to 10 parts by volume of sulfuric acid and 1 part by volume of water, saturated with potassium dichromate, at a temperature of 10 to 80° C.

If the volume ratio of sulfuric acid to water as described above is less than 1, pits of surface roughness in the form of a mountain chain occur on the mirror surface of the crystal surface, while if more than 10, precipitation of Group VI element is too remarkable to effect a predetermined surface cleaning.

Even if using the above described mixed aqueous solution of sulfuric acid and water, an etching solution containing potassium dichromate in an unsaturated concentration results in occurrence of pits of surface roughness in the form of a mountain chain on the mirror surface of the crystal surface and accord ingly, it is necessary to use a saturated solution of potassium dichromate.

Furthermore, the above described effects can be obtained by carrying out the above described etching treatment at a temperature of 10 to 80° C. If the etching treatment is carried out at a temperature of lower than 10° C., there occur pits of surface roughness in the form of a mountain chain on the crystal surface, while if higher than 80° C., precipitation of Group VI element is too remarkable to sufficiently remove the Group VI element even by the methods of the foregoing (2) to (7).

On the other hand, when a compound semiconductor crystal of Group II–VI elements of Periodic Table is subjected to the foregoing etching treatment, the crystal surface can be converted into a flat and mirror-like state as described above, but the end part of the crystal, surface sometimes turns slightly red. When studying this turning red phenomenon in detail, it is observed during washing after the etching treatment. This is probably due to that the sulfuric acid in the etching solution remains on the crystal surface and the Group II element on the crystal surface is thus dissolved, but the Group VI element remains red.

In the present invention, accordingly, it is preferable to suppress precipitation of the Group VI element on the crystal surface by carrying out the foregoing etching treatment and then ① washing with water at a temperature of from 10° C. to the boiling point or ② washing with methanol or isopropyl alcohol.

When the precipitation of the Group VI element is not sufficiently suppressed even if the above described treatment ① or ② is carried out, it is preferable to remove the Group VI element in a very small amount remaining on the crystal surface and thus to render a ratio of Group II element/Group VI element stoichiometric by ③ effecting ultrasonic washing or boiling washing in at least one member selected from the group consisting of dichloromethane, trichloroethylene and acetone, ④ subjecting to a heat treatment in an inert gas at a temperature of at least 200° C. or ⑤ immersing in a solution containing carbon disulfide and/or carbon tetrachloride.

Furthermore, it is preferable to remove an oxide of Group II element and/or Group VI element on the crystal surface by treating by any one of the methods described in the foregoing ③ to ⑤ and then ⑥ immersing in a solution containing hydrochloric acid, solution containing hydrofluoric acid or solution containing ammonium hydroxide and methanol.

The following examples are given in order to illustrate the invention in detail without limiting the same.

EXAMPLE 1

A cleaning test of a surface of ZnSe single crystal substrate was carried out.

An etching treatment was carried out by immersing in an etching solution consisting of potassium dichromate/sulfuric acid/water each having a composition described in Table 1 at 25° C. for 10 minutes.

TABLE 1

| Condition | $H_2O:H_2SO_4$ | Etching Temperature (° C.) | Potassium Dichromate | Surface State |
|---|---|---|---|---|
| (1) | 1:2 | 25 | saturated | Surface B |
| (2) | 1:2 | 25 | unsaturated | Surface A |
| (3) | 1:5 | 25 | saturated | Surface B |
| (4) | 1:5 | 25 | unsaturated | Surface A |
| (5) | 1:9 | 25 | saturated | Surface B |
| (6) | 1:9 | 25 | unsaturated | Surface A |
| (7) | 1:0.7 | 25 | saturated | Surface A |
| (8) | 1:0.7 | 25 | unsaturated | Surface A |
| (9) | 1:12 | 25 | saturated | Surface C |
| (10) | 1:12 | 25 | unsaturated | Surface C or A |

Figure 1B:
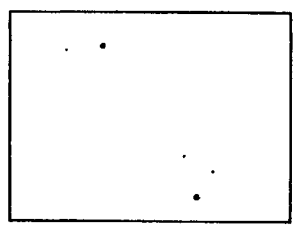
Figure 1C:
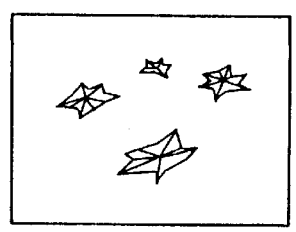

When the crystal surface after the etching treatment was observed using a Nomarski microscope, it was found that the surface states were classified into the following three kinds of patterns (Cf. FIG. 1):

Surface A: mirror surface, having pits of surface roughness in the form of a mountain chain occurred.

Surface B: mirror surface, having fine pits occurred but no roughness on the basis.

Surface C: having a large amount of Se precipitated on the surface (which cannot be removed by the treatment of Example 2 or 3).

As is evident from Table 1, a crystal surface having a flat and mirror-like state corresponding to Surface B of Table 1 could be reproduced by the use of an etching solution consisting of a mixed aqueous solution of sulfuric acid and water in a sulfuric acid to water proportion of 1:1 to 10, saturated with potassium dichromate. When the sulfuric acid to water proportion was outside the above described range or potassium dichromate was not saturated therein, the crystal surface became A or C and no predetermined crystal surface could be obtained.

When etching was carried out by changing, in Condition (1) of Table 1, the etching temperature as shown in Table 2 and changing the concentration of the potassium dichromate as shown in Table 2, results as shown in Table 2 were obtained.

When etching was carried out using the etching solution saturated with potassium dichromate at a temperature of 10 to 80° C., as shown in Table 2, a crystal surface having a flat and mirror-like state corresponding to Surface B could be reproduced. On the other hand, when potassium dichromate was unsaturated or the etching temperature was outside the above described range, the crystal surface became A or C and no predetermined crystal surface could be obtained.

TABLE 2

| Condition | $H_2O:H_2SO_4$ | Etching Temperature (° C.) | Potassium Dichromate | Surface State |
|---|---|---|---|---|
| (11) | 1:2 | 12 | saturated | Surface B |
| (12) | 1:2 | 12 | unsaturated | Surface A |
| (13) | 1:2 | 25 | saturated | Surface B |
| (14) | 1:2 | 25 | unsaturated | Surface A |
| (15) | 1:2 | 75 | saturated | Surface B |
| (16) | 1:2 | 75 | unsaturated | Surface A |
| (17) | 1:2 | 8 | saturated | Surface A |
| (18) | 1:2 | 8 | unsaturated | Surface A |
| (19) | 1:2 | 85 | saturated | Surface C |
| (20) | 1:2 | 85 | unsaturated | Surface A or C |

COMPARATIVE EXAMPLE 1

When etching was carried out at 40° C. by changing the etching solution of Example 1 to an etching solution of hydrogen peroxide water/sulfuric acid/water (ratio=1:4:1), the crystal surface was of Surface State C and Se was precipitated in a large amount.

EXAMPLE 2

When a crystal surface etched by Condition (1) in Table 1 of Example 1 was observed in detail, there was found an area turned red at the end. This was probably due to the sulfuric acid in the etching solution remaining on the crystal surface to dissolve only Zn on ZnSe surface, thus resulting in retaining of Se and turning red.

The crystal surface etched by Condition (1) in Table 1 of Example 1 was thus washed by Conditions shown in Table 3 and Se remained on the crystal surface, namely, Se/Zn ratio was investigated by XPS (X-ray photo-electron spectroscopy). The results are shown in Table 3.

TABLE 3

| Condition | Washing Method | Washing Temperature (° C.) | Se/Zn Ratio |
|---|---|---|---|
| (21) | water | 8 | 1.60 |
| (22) | water | 25 | 1.30 |
| (23) | methanol | 25 | 1.25 |
| (24) | water | 12 | 1.45 |
| (25) | water | 40 | 1.25 |

As is evident from the results of Table 3, washing after the etching treatment is preferably carried out using water or methanol at 10° C. or higher. The Se/Zn mole ratio is preferably adjusted to at most 1.50. When this ratio is higher, e.g. 1.60 as in the case of Condition (21), complete removal of Se is impossible even by the following treatment and epitaxial growth of a high quality compound semiconductor crystal of Group II–VI element of Periodic Table cannot be carried out on the thus treated crystal surface.

This washing is preferably carried out at a higher temperature than the etching treatment temperature so as to reduce the Se/Zn mole ratio. When the washing effect was investigated using isopropyl alcohol instead of methanol, the isopropyl alcohol showed the similar effect to methanol.

EXAMPLE 3

The crystal surface washed by Condition (22) in Table 3 of Example 2 was treated by Conditions shown in Table 4 and the Se/Zn ratio of this surface was investigated by XPS. The results are shown in Table 4.

As is apparent from Table 4, when the treatment was carried out under conditions of Table 4, Se remaining on the crystal surface was substantially removed.

TABLE 4

| Condition | Treatment Method | Se/Zn |
|---|---|---|
| (26) | ultrasonic washing with trichloroethyelne 10 min. | 1.15 |
| (27) | ultrasonic washing with trichloroethyelne 10 min., ultrasonic washing with acetone for 5 min. and ultrasonic washing with trichloroethyelne 10 min. | 1.05 |
| (28) | Treatment (27) was repeated three times. | 1.00 |
| (29) | heat treatment in $N_2$ at 200° C. for 15 min. | 1.00 |
| (30) | treatment in $CS_2$ solution at room temperature for 30 sec. | 1.10 |
| (31) | treatment in $CCl_4$ solution at room temperature for 30 sec. | 1.05 |

When a similar treatment was carried out using dichloromethane in place of trichloroethylene in the foregoing treatment, substantially similar effects to trichloroethylene could be obtained. When the foregoing treatment was repeated except carrying out boiling washing in place of the ultrasonic washing, similar effects to the case of carrying out the ultrasonic washing could be obtained. Furthermore, the heat treatment temperature of Condition (29) in Table 4 was preferably adjusted to a range of 200 to 350° C. If the temperature was higher than 350° C., disadvantages such as roughening of the crystal surface, etc. took place.

EXAMPLE 4

The crystal washed by Condition (28) in Table 4 of Example 3 was treated so as to remove oxides on the surface by ① immersing in a ten times diluted solution of hydrochloric acid (36 weight %) at room temperature for 2 minutes or ② immersing in a mixed solution of ammonia and methanol in a proportion of 1:3 at room temperature for 2 minutes or ③ immersing in a ten times diluted solution of hydrofluoric acid (47 weight %) at room temperature for 2 minutes. The atomic reconstruction structure of the resulting ZnSe crystal surface was investigated.

The atomic reconstruction structure was judged by introducing the treated crystal into a molecular beam epitaxial growth chamber (MBE chamber) and investigating an atomic reconstruction pattern by a reflection high energy electron diffraction method (RHEED). When the oxides were removed and the crystal surface was cleaned, there appeared a C (2×2) reconstruction pattern of Zn atom or a (2×1) reconstruction pattern of Se atom. The pressure of MBE chamber was adjusted to $1 \times 10^{-10}$ Torr and the crystal was heated at a temperature raising rate of 10° C./min to 500° C. When the temperature of the crystal exceeded 200° C., a Se molecular beam was irradiated at a pressure of $5 \times 10^{-6}$ Torr.

When the ZnSe crystal treated by the above described conditions ①, ② and ③ was subjected to investigation of the atomic reconstruction pattern by RHEED, there appeared a C (2×2) reconstruction pattern of Zn atom, simultaneously with when the temperature of the crystal reached 500° C., which taught that the oxides were removed from the crystal surface. Even when the above described treatments ①, ② and ③ were carried out immediately after the etching and washing, similar results were obtained.

For comparison, when the ZnSe crystal obtained by the treatment of Example 3 was subjected to investigation of the atomic reconstruction pattern by RHEED, there appeared a C (2×2) reconstruction pattern of Zn atom after the temperature of the crystal had reached 500° C. and 30 minutes to 1 hour had passed.

For comparison, furthermore, when the ZnSe crystal obtained by the treatment of Example 2 was subjected to investigation of the atomic reconstruction pattern by RHEED, the above described reconstruction pattern of the atom did not appear even if the crystal was treated at 500° C. for several hours.

ADVANTAGES OF THE INVENTION

According to use of the above described construction of the present invention, a surface of a compound semiconductor crystal of Group II–VI elements of Periodic Table can be cleaned to obtain a mirror surface suitable for epitaxial growth, without deteriorating the smoothness of the surface and after etching.

What is claimed is:

1. A method of cleaning a surface of a compound semiconductor crystal of Group II–VI elements of Periodic Table, which comprises etching the compound semiconductor crystal with an etching solution at a temperature of about 10 to 80° C., wherein the etching solution consists of an aqueous solution of sulfuric acid and water in a proportion by volume of 1 to 10 parts of sulfuric acid to 1 part of water, saturated with potassium dichromate.

2. The method as claimed in claim 1, further comprising removing the etching solution from the compound semiconductor crystal by washing the compound semiconductor crystal with water at a temperature of about 10° C. to the boiling point thereof to suppress precipitation of the Group VI element.

3. The method as claimed in claim 2, further comprising removing the Group VI element precipitated on the crystal surface after washing by ultrasonic washing or boiling washing the compound semiconductor crystal in dichloromethane or trichloroethylene.

4. The method as claimed in claim 3, further comprising removing the Group VI element precipitated on the crystal surface after washing by ultrasonic washing or boiling washing the compound semiconductor crystal in acetone, and in dichloromethane or trichloroethylene.

5. The method as claimed in claim 4, further comprising removing oxides on the crystal surface by immersing the compound semiconductor crystal in a solution comprising hydrochloric acid, hydrofluoric acid or ammonium hydroxide, and methanol.

6. The method as claimed in claim 3, further comprising removing oxides on the crystal surface by immersing the compound semiconductor crystal in a solution comprising hydrochloric acid, hydrofluoric acid or ammonium hydroxide, and methanol.

7. The method as claimed in claim 2, further comprising removing the Group VI element precipitated on the crystal surface after washing by heat treating the compound semiconductor crystal at a temperature of at least 200° C.

8. The method as claimed in claim 7, further comprising removing oxides on the crystal surface by immersing the compound semiconductor crystal in a solution comprising hydrochloric acid, hydrofluoric acid or ammonium hydroxide, and methanol.

9. The method as claimed in claim 2, further comprising removing the Group VI element precipitated on the crystal surface after washing by immersing the compound semiconductor crystal in a solution comprising carbon disulfide or carbon tetrachloride.

10. The method as claimed in claim 9, further comprising removing oxides on the crystal surface by immersing the compound semiconductor crystal in a solution comprising hydrochloric acid, hydrofluoric acid or ammonium hydroxide, and methanol.

11. The method as claimed in claim 2, further comprising removing oxides on the crystal surface after washing by immersing the compound semiconductor crystal in a solution comprising hydrochloric acid, hydrofluoric acid or ammonium hydroxide, and methanol.

12. The method as claimed in claim 1, further comprising removing the etching solution from the compound semiconductor crystal by washing the compound semiconductor crystal with methanol or isopropyl alcohol to suppress precipitation of the Group VI element.

13. The method as claimed in claim 12, further comprising removing the Group VI element precipitated on the crystal surface after washing by ultrasonic washing or boiling washing the compound semiconductor crystal in dichloromethane or trichloroethylene.

14. The method as claimed in claim 13, further comprising removing the Group VI element precipitated on the crystal surface after washing by ultrasonic washing or boiling washing the compound semiconductor crystal in acetone, and in dichloromethane or trichloroethylene.

15. The method as claimed in claim 12, further comprising removing the Group VI element precipitated on the crystal surface after washing by heat treating the compound semiconductor crystal at a temperature of at least 200° C.

16. The method as claimed in claim 12, further comprising removing the Group VI element precipitated on the crystal surface after washing by immersing the compound semiconductor crystal in a solution comprising carbon disulfide or carbon tetrachloride.

17. The method as claimed in claim 12, further comprising removing oxides on the crystal surface after washing by immersing the compound semiconductor crystal in a solution comprising hydrochloric acid, hydrofluoric acid or ammonium hydroxide, and methanol.

* * * * *